United States Patent [19]

Tsunekawa et al.

[11] Patent Number: 4,599,135

[45] Date of Patent: Jul. 8, 1986

[54] THIN FILM DEPOSITION

[75] Inventors: Sukeyoshi Tsunekawa, Tokorozawa; Yoshio Homma, Tokyo; Hiroshi Morisaki, Hachioji; Sadayuki Okudaira, Ome; Kiichiro Mukai, Hachioji, all of Japan

[73] Assignee: Hitachi, Ltd., Tokyo, Japan

[21] Appl. No.: 655,438

[22] Filed: Sep. 28, 1984

[30] Foreign Application Priority Data

Sep. 30, 1983 [JP] Japan .................. 58-180236
May 2, 1984 [JP] Japan .................. 59-87705

[51] Int. Cl.$^4$ .............. B44C 1/22; C03C 15/00; B05D 3/06; C23C 14/00
[52] U.S. Cl. .............. 156/643; 118/50.1; 118/620; 118/730; 156/345; 156/657; 204/192 EC; 204/192 E; 204/298; 427/38
[58] Field of Search .......... 118/730, 50.1, 620; 156/345, 643, 646, 653, 657; 204/164, 192 EC, 192 E, 298; 427/38, 39

[56] References Cited

U.S. PATENT DOCUMENTS 3,563,809  2/1971  Wilson .................. 148/1.5

FOREIGN PATENT DOCUMENTS 5621836  5/1981  Japan .

OTHER PUBLICATIONS

ECS Abstract, No. 148, 1982, pp. 233-234, Low Temperature Deposition Apparatus Using An Electron Cyclotron Resonance Plasma, Matsuo et al.
Ionics, Aug. 1981, pp. 1-10, T. Yaita.
IBM Technical Disclosure Bulletin, vol. 21, No. 11, Apr. 1979, Platinum Contact/Chromium Barrier Metallurgical Processing Technique by Ion Milling, Gartner et al., pp. 4503-4504.

Primary Examiner—William A. Powell
Attorney, Agent, or Firm—Antonelli, Terry & Wands

[57] ABSTRACT

In a thin film deposition apparatus, means for depositing a film on a substrate and means for etching the deposited film to make flat the surface thereof, are provided in a reaction vessel independently of each other. This apparatus can rapidly deposit the film without rising the temperature of the substrate excessively. Further, since the deposition means and etching means are independent of each other, the deposition of a film on the substrate and the planarization of the surface of the deposited film can be achieved under various conditions.

28 Claims, 4 Drawing Figures

_4,599,135_

THIN FILM DEPOSITION

BACKGROUND OF THE INVENTION

The present invention relates to a thin film deposition, and more particularly to a thin film deposition suitable for the deposition of an insulating film such as an $SiO_2$ film.

As described in a Japanese patent application specification (Publication No. 56-21836), the so-called bias sputtering method has hitherto been used to flatten the surface of a deposited thin film while depositing the thin film on a substrate. The bias sputtering method, in which sputtering is carried out while applying a bias voltage to a body whose surface is to be coated with a film, has an advantage that the deposition of, for example, an $SiO_2$ film on the body and the smoothening of the surface of the deposited $SiO_2$ film are simultaneously achieved. In the bias sputtering method, a film, for example, an $SiO_2$ film is formed in such a manner that part of the deposited $SiO_2$ film is etched while depositing $SiO_2$ on a substrate by sputtering a target made of quartz or the like, and the surface of the deposited $SiO_2$ film is smoothened on the basis of the fact that the etching rate at the film deposition period depends on the shape of the substrate.

That is, in the bias sputtering method, the etching rate at an angled, sloped or stepped surface portion of a substrate is larger than the etching rate at a flat surface portion of the substrate. Therefore, a projection or eaves at the surface of a deposited film caused by a projection or step at a substrate surface becomes small as the thickness of the deposited film grows, and finally the surface of the deposited film is smoothened.

In order to make the surface of the deposited film sufficiently even by the bias sputtering method, it is required to determine the etching rate at the film deposition period so that a resputtering ratio of 30 to 80% is obtained. Incidentally, the term "resputtering ratio" means a ratio $(a-b)/a$, where a indicates a deposition rate at a time when a film is deposited without being etched, and b a deposition rate at a time when the film is deposited while being etched. In order to satisfy the above requirement, the RF power supplied to a substrate (namely, a body on which a film is to be deposited) is put in a range from 15 to 40% of the RF power supplied to the target. As a result, the substrate is exposed directly to glow discharge, and thus there arises a problem that the temperature of the substrate is raised not only by the condensation energy of $SiO_2$ and the collision energy of charged particles, but also by the radiation energy from the glow discharge.

An insulator such as $SiO_2$ is smaller in sputtering yield and deposition rate, as compared with a metal. Accordingly, in order for the $SiO_2$ film to have a sufficiently large deposition rate, it is required to make larger the RF power supplied to the target. Thus, the radiation energy from the target also elevates the temperature of the substrate (namely, the substrate temperature).

Further, in the bias sputtering method, sputtering is used for the deposition of film. Accordingly, there arises another problem that the deposition rate is relatively small. It has been earnestly desired to solve these problems.

SUMMARY OF THE INVENTION

An object of the present invention is to provide a thin film deposition technique which can solve the above-mentioned problems of the prior art, and can deposit a thin film with a flattened or smoothened surface on a substrate without producing any adverse effect on the substrate, even when the surface of the substrate is uneven or stepwise.

In order to attain the above object, according to the present invention, there is provided a thin film deposition apparatus in which means for depositing a film and means for etching the deposited film are provided in a vacuum vessel (that is, a reaction vessel) to be individually independent, and these means are simultaneously or alternately used to deposit a thin film with an even or smoothened surface on a substrate.

Since a thin film deposition apparatus according to the present invention has the above construction, the plasma or glow discharge generated by the film deposition means and etching means can be localized in the vicinity of each of these means so that the influence of the plasma or glow-discharge on the substrate can be reduced, and that the temperature rise of the substrate can be suppressed.

In contrast to the above, when the plasma or glow descharge is not localized in the vicinity of each of the film deposition means and etching means, the film deposition rate is very large, though the temperature rise of the substrate is not suppressed. Accordingly, by varying the degree of localization of the plasma or glow-discharge in the vicinity of each means, the substrate temperature and the film deposition rate can be adjusted, and are set to optimum values in accordance with the material and purpose of a film.

Further, since the film deposition means and etching means are provided independently of each other, the deposition rate of a film and the etching rate for the film can be changed independently of each other.

The above-mentioned features of the present invention are never obtained by a conventional bias sputtering apparatus.

DESCRIPTION OF THE PREFERRED EMBODIMENTS

Figure 1:
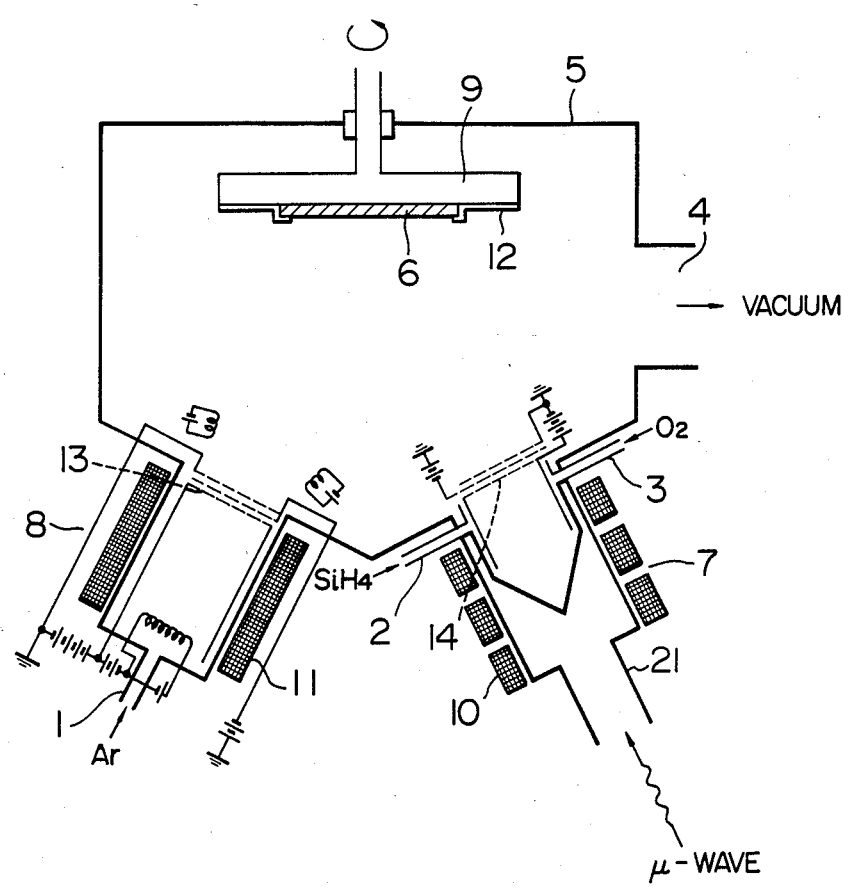
FIG. 1 is a schematic view showing an embodiment of a thin film deposition apparatus according to the present invention.

FIG. 1 shows an embodiment of a thin film deposition apparatus according to the present invention. In the present embodiment, a film is deposited on a substrate by plasma excited CVD (chemical vapor deposition) using a microwave discharge ion source, and the deposited film is etched by sputtering using a hot filament type ion source (namely, a Kaufman type ion source). Referring to FIG. 1, a vacuum vessel 5 serving as a reaction vessel is provided with gas inlets 1, 2 and 3 and a gas outlet 4, and further provided with a microwave discharge ion source 7 provided with a magnet 10 for depositing a film on a substrate 6, and a hot filament type ion source (namely, a Kaufman type ion source) 8 also provided with a magnet 11 for etching the surface of the substrate 6. The ion sources 7 and 8 are provided independently of each other and of the susceptor 9. The substrate 6 is held on the rotatable susceptor 9 by a quartz member 12.

Now, the case where an SiO film is deposited on the substrate 6, will be explained below, by way of example. First, the vacuum vessel 5 is evacuated through the outlet 4 to a pressure of $10^{-4}$ to $10^{-5}$ Pa (namely, $1/1.333 \times 10^{-6}$ to $1/1.333 \times 10^{-7}$ Torr). Next, microwave power having a frequency of 2.45 GHz is supplied to the microwave discharge ion source 7 through a rectangular waveguide 21, and monosilane $SiH_4$ and oxygen $O_2$ are introduced into the vacuum vessel 5 through the gas inlets 2 and 3, respectively, to react $SiH_4$ with $O_2$ by microwave discharge. Thus, the $SiO_2$ film is deposited on the substrate 6 by CVD (chemical vapor deposition).

On the other hand, argon is introduced into the vacuum vessel 5 through the gas inlet 1, and electric power is supplied to the hot filament type ion source 8, to generate argon ions. An argon ion beam formed by accelerating the argon ions between grids 13 is incident on the substrate 6 to etch the $SiO_2$ film deposited on the substrate 6 (etching rate being dependent on the surface structure), thereby flattening the surface of the $SiO_2$ film.

The microwave discharge ion source 7 for depositing a film and the hot filament type ion source 8 for etching the film may be, for example, an ECR (electron cyclotron resonance) plasma ion source described in an article by S. Matsuo et al. (1982 ECS Abstract, No. 148, pages 233 and 234) and an ion source described in an article by T. Yaita (IONICS, August, 1981, pages 1 to 10), respectively.

The substrate 6 is mounted on the susceptor 9 whose inside is water-cooled, by an electrostatic chuck, and is rotated together with the susceptor 9.

In the present embodiment, the bombardment of the substrate 6 with charged particles from the microwave discharge ion source 7 is prevented by grids 14, and thus the temperature rise of the substrate 6 is suppressed.

Figure 2:
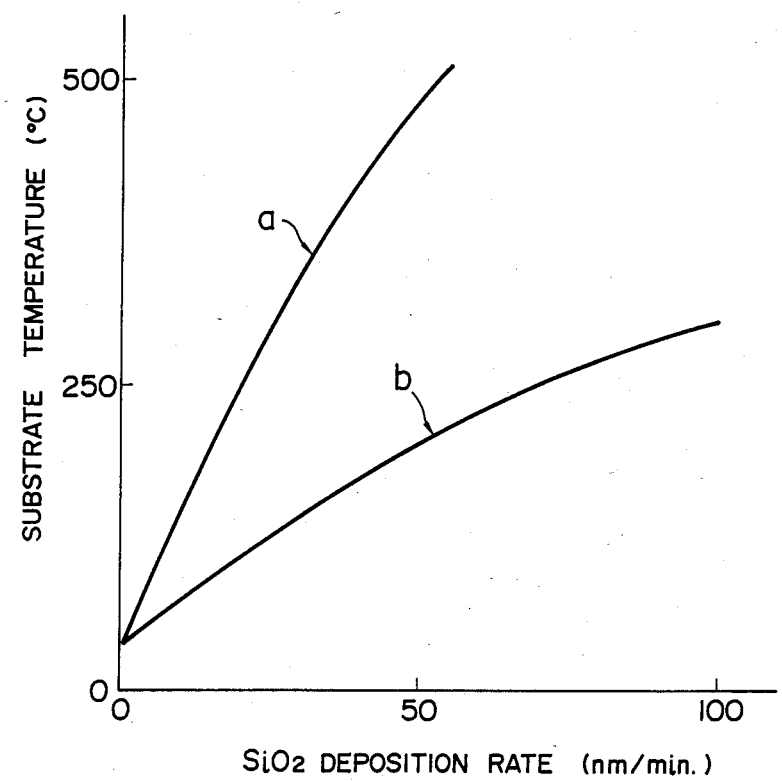
FIG. 2 is a graph showing a remarkable effect of the present invention.

FIG. 2 is a graph showing typical practical relationships between $SiO_2$ deposition rate and substrate temperature. In FIG. 2, curves a and b indicate the above relationship according to the conventional bias sputtering method and that according to the present invention, respectively. The curve b shows the experimental results which were obtained by using the present embodiment in a state that the pressure inside the vacuum vessel 5 was made equal to $6.7 \times 10^{-2}$ Pa (namely, $6.7/1.333 \times 10^{-4}$ Torr), a distance between the center of the substrate 6 and each of the ion sources 7 and 8 was made equal to 15 cm, and a ratio of the etching rate to the deposition rate at a film deposition period was made equal to 30%.

As is apparent from FIG. 2, when an $SiO_2$ film is deposited in accordance with the present invention, an increase in substrate temperature is far smaller, as compared with the case where an $SiO_2$ film is deposited in the conventional bias sputtering method. For example, an increase in substrate temperature caused by depositing an $SiO_2$ film at a rate of 50 mm/min in the present embodiment is less than or equal to one-half an increase in substrate temperature caused by depositing an $SiO_2$ film at the same rate in the conventional bias sputtering method.

Further, in the case where a permissible increase in substrate temperature is 250° C., as is apparent from FIG. 2, the deposition rate in the present embodiment can be made three times or more larger than that in the conventional bias sputtering method.

The suppression of substrate temperature in the present embodiment is considered to be based upon the following facts: plasma sources (that is, the ion sources 7 and 8) are spaced apart from the substrate, and thus the thermal radiation to the substrate is reduced. Additionally, the bombardment of the substrate with charged particles from the microwave discharge ion source 7 is prevented by the grids 14.

Figure 3:
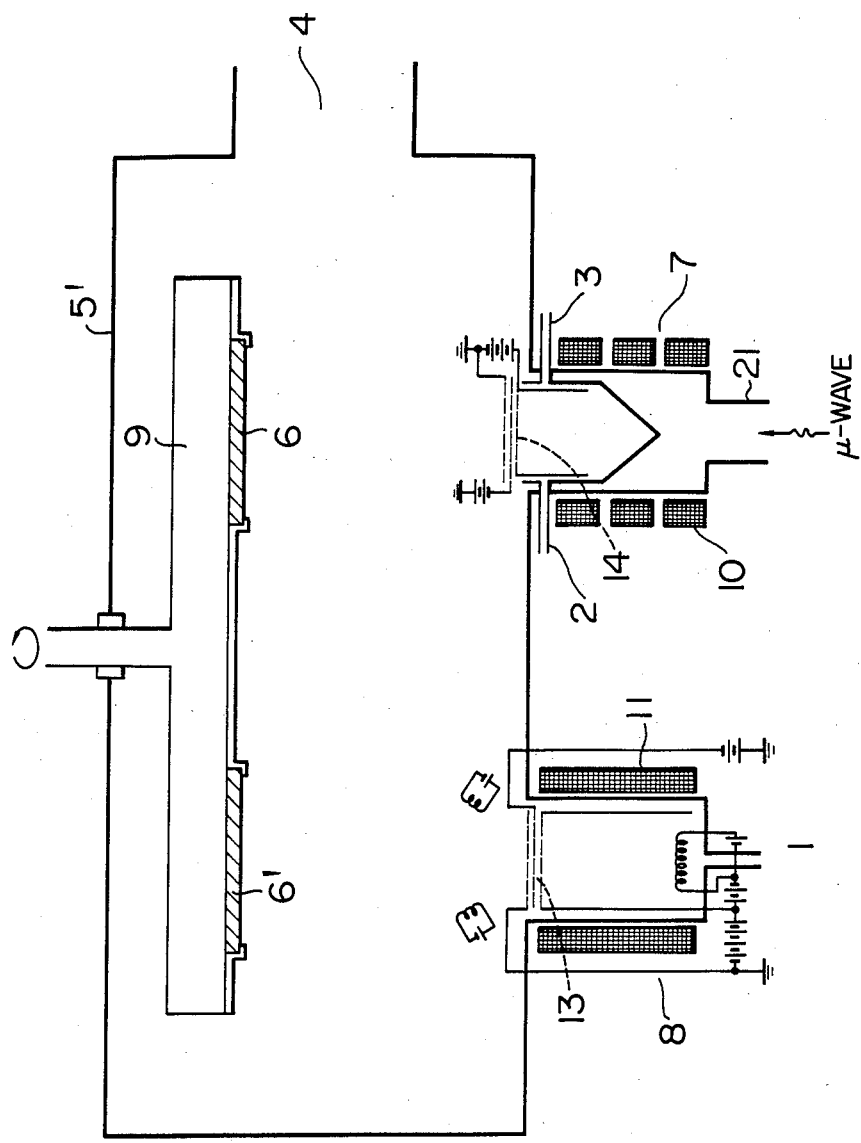
FIG. 3 is a schematic view-showing another embodiment of a thin film deposition apparatus according to the present invention.

FIG. 3 shows another embodiment of a thin film deposition apparatus according to the present invention. Referring to FIG. 3, the microwave discharge ion source 7 for depositing a film and the hot filament type ion source 8 for etching the film are both provided at the bottom of a vacuum vessel 5', and the rotatable susceptor 9 is provided face to face with the ion sources 7 and 8. A plurality of substrates (for example, silicon substrates) 6 and 6' are mounted on the surface of the susceptor 9, and the ion sources 7 and 8 are both operated, while rotating the susceptor 9. Thus, the productivity can be raised by increasing the number of substrates mounted on the susceptor.

Accordingly, when each of the substrates 6 and 6' is located above the microwave discharge ion source 7, an $SiO_2$ film can be deposited on each substrate by the CVD method as in the embodiment shown in FIG. 1. When each substrate is located above the hot filament type ion source 8, the deposited $SiO_2$ film is etched by argon ions. That is, the deposition of the $SiO_2$ film and the etching thereof are alternately carried out. Accordingly, when each of the substrates 6 and 6' is located at positions other than the positions facing the ion sources 7 and 8, each substrate does not receive thermal radiation from the ion sources 7 and 8 but is cooled. Therefore, the temperature rise of each substrate is further suppressed, as compared with the embodiment shown in FIG. 1. Thus, the deposition of the $SiO_2$ film and the planarization of the surface of the deposited $SiO_2$ film can be achieved, while suppressing the temperature rise of each substrate.

In the foregoing, only the case where on $SiO_2$ film is formed by using $SiH_4$ and $O_2$ as raw material gases, has been shown. However, the embodiments shown in FIGS. 1 and 3 are not limited to such a case, but can be used for depositing other insulating films such as an $Si_3N_4$ film and a phosphosilicate glass film, metal films, and alloy films.

In the embodiments shown in FIGS. 1 and 3, a plasma for promoting a chemical reaction between raw material gases is generated by the microwave discharge ion source 7. However, other plasma generating means such as an RF plasma generator may be used in place of the microwave discharge ion source 7.

In order to flatten an uneven surface of a deposited film by sputtering, the deposited film may be bombarded with ions other than the argon ion which has been used in the foregoing explanation. Further, the deposited film may be bombarded with a particle beam other than an ion beam, for example, a neutral particle beam.

In the embodiments shown in FIGS. 1 and 3, the hot filament type ion source 8 is used for etching the deposited film by the sputtering method. However, a microwave discharge ion source or a saddle field type ion source may be used for the same purpose, in place of the hot filament type ion source 8.

In the embodiments shown in FIGS. 1 and 3, a film is deposited on a substrate by the plasma excited CVD method. Although the deposition rate is decreased, the film may be deposited by the sputtering method. In this case, an inert gas is introduced into the microwave discharge ion source 7, in place of reactive gases such as $SiH_4$ and $O_2$, and a quartz plate is disposed on the wall of the ion source 7 on the aperture side thereof. Then, $SiO_2$ is sputtered from the quartz plate, and an $SiO_2$ film is deposited on a substrate.

Further, in the embodiments shown in FIGS. 1 and 3, various means for smoothly operating these embodiments, such as shutter means disposed between the substrate and the ion sources 7 and 8, may be additionally provided.

In such embodiments, since means for depositing a film and means for etching the film to flatten an uneven surface are both provided in the same reaction vessel, it is preferred that the operating pressures of these means are on the same order of magnitude.

Prior to explaining a further embodiment of a thin film deposition according to the present invention, the deposition of a film on an uneven substrate surface will be discussed.

When a film is deposited in a conventional bias sputtering apparatus, the pressure inside a reaction vessel is put in a range from $1 \times 10^{-1}$ to $1 \times 10^{-2}$ Torr if a diode type electrode is used as a cathode, and put in a range from $1 \times 10^{-2}$ to $1 \times 10^{-3}$ Torr if a planar magnetron type electrode is used as the cathode. In the case where a substrate surface to be coated with a deposited film is extremely uneven, it is desired that the pressure inside the reaction vessel is low so that the diffusion of a reaction gas is enhanced or the mean free path of a reactive gas is long. However, the above mean free path is several millimeters for the case where the diode type electrode is used, and is tens of millimeters for the case where the planar magnetron type electrode is used. Accordingly, it is very difficult to deposit a homogeneous film even at a deep recess in the substrate surface.

Figure 4:
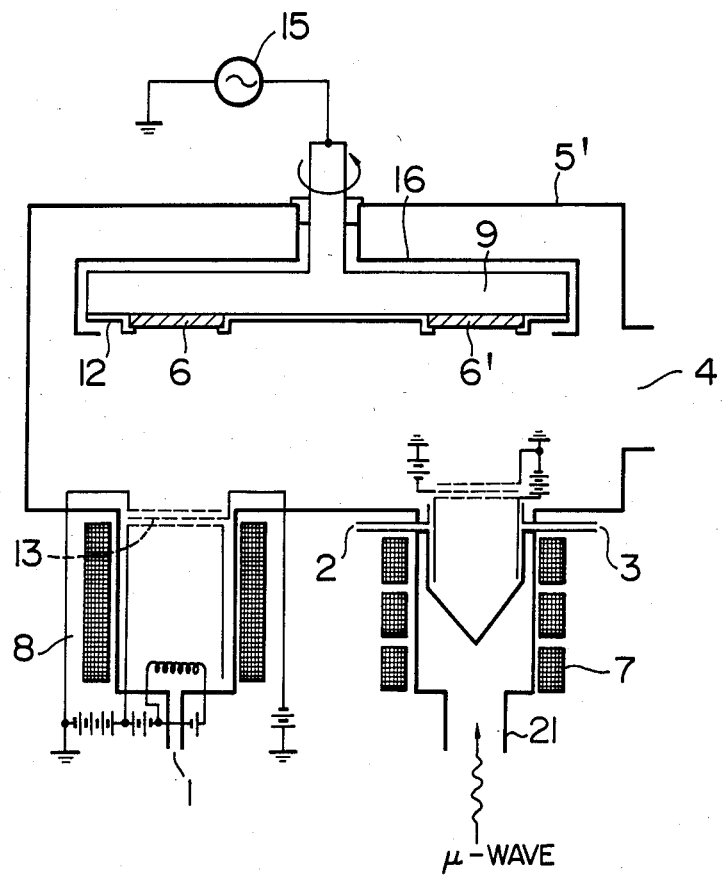
FIG. 4 is a schematic view showing a further embodiment of a thin film deposition apparatus according to the present invention.

FIG. 4 shows a further embodiment of a thin film deposition apparatus according to the present invention. Like the embodiments shown in FIGS. 1 and 3, the present embodiment utilizes microwave discharge or glow discharge to deposit a thin film and to flatten the surface of the deposited film, and such discharge is generated at a place spaced apart from a substrate to reduce the pressure of gas at the surface of the substrate. Further, it is necessary to prevent the substrate from being charged with charged particles incident upon the substrate when an insulating film is deposited on the substrate, or to prevent the substrate from being locally charged when the substrate includes portions made of different materials. In the present embodiment, the electric charge on the substrate is neutralized or the substrate is kept at a constant potential. Referring now to FIG. 4, the vacuum vessel 5' serving as a reaction vessel is provided with the gas inlets 1, 2 and 3 and the gas outlet 4, and further provided with the microwave discharge ion source 7 for depositing a film on the substrates 6 and 6', and the hot filament type ion source 8 for etching part of the deposited film to flatten the surface thereof. The ion sources 7 and 8 are provided individually independent. Further, in order to neutralize surface charges of the substrates, thereby keeping each substrate at a constant potential, a high-frequency voltage from a high-frequency power source 15 is applied to the substrates 6 and 6' through the susceptor 9 which is shielded by a conductive plate 16.

Now, the case where an $SiO_2$ film is deposited on the substrates 6 and 6', will be explained below, by way of example. First, the vacuum vessel 5' is evacuated through the outlet 4 to a pressure of about $1 \times 10^{-6}$ Torr. Next, microwave power having a frequency of 2.45 GHz is supplied to the microwave discharge ion source 7, and monosilane $SiH_4$ and oxygen $O_2$ are introduced into the ion source 7 through the gas inlets 2 and 3, to generate microwave discharge, thereby reacting $SiH_4$ with $O_2$. Thus, an $SiO_2$ film is deposited on the substrates 6 and 6' through a CVD method. On the other hand, argon is introduced in the hot filament type ion source 8 through the gas inlet 1, and electric power is supplied to the ion source 8 to generate argon ions. An argon ion beam is formed by accelerating the argon ions between the grids 13, and the substrates 6 and 6' are bombarded with the argon ion beam to etch part of the $SiO_2$ film deposited on each substrate, thereby making flat the surface of the deposited $SiO_2$ film. The substrates 6 and 6' are attached to the susceptor 9 whose inside is water-cooled, and a high-frequency voltage having a frequency of 13.56 MHz from the high-frequency power source 15 is applied to the substrates 6 and 6' through the susceptor 9, while rotating the susceptor 9. According to such a film deposition process, generation of eaves at the edge of a recess is positively prevented by etching and a thin film can be deposited in a higher vacuum, as compared with the conventional bias sputtering method. At higher vacuum, the diffusion length or the mean free path of particles which are to be deposited on a substrate to form the thin film, can be made long. Thus, a homogeneous film can be formed even at a deep recess in the surface of the substrate, and the surface of the deposited film can be made smooth.

An $SiO_2$ film was deposited on a silicon wafer having a circuit pattern therein, at a rate of 300 Å min to a thickness of 1 μm, by using the present embodiment in a state that the pressure inside the vacuum vessel 5' was made equal to $5 \times 10^{-4}$ Torr, a minimum distance between each of the centers of the substrates 6 and 6' and each of the ion sources 7 and 8 was made equal to 15 cm, and a ratio of the etching rate of the deposited $SiO_2$ film to the deposition rate of $SiO_2$ film was made equal to 30% for the film deposition period.

The quality of the $SiO_2$ film thus deposited was investigated using an etchant which contained 7 volumes of a 40% solution of $NH_4F$ and 1 volume of a 50% solution of HF, and was kept at 25° C. It was found that the etching rate for the $SiO_2$ film at a recess having a width of 1 μm and a depth of 2 μm was approximately equal to the etching rate at a flat portion, that is, the etching rate was 1200 Å min at both of the recess and the flat portion. However, in the case where the high-frequency voltage was not applied to a silicon wafer, it was found that the etching rate was increased in a portion of a recess similar to the above-mentioned recess. This is because electric charges on the silicon wafer prevents the surface of the deposited $SiO_2$ film from being uniformly etched by the argon ion beam from the hot filament type ion source 8.

According to the present embodiment, even when the surface of a substrate is extremely uneven, a homogeneous, thin film having a smoothened surface can be deposited on the substrate. Then, step coverage of the overlying film to be next formed is improved. Further, the application of a high-frequency voltage for keeping a substrate at a constant potential can produce another effect. That is, when a film is deposited on a substrate having therein a field effect transistor, the damage to the field effect transistor caused by the film deposition such as a decrease in gate breakdown voltage and variations in threshold voltage, can be reduced by the application of the high-frequency voltage.

In the above description, the case where an SiO₂ film is deposited by the present embodiment, has been explained. However, the present embodiment is not limited to such a case, but is applicable to the deposition of insulating films other than the SiO₂ film, metal films, and alloy films. Further, in the above description, argon, monosilane and oxygen have been used as working gases. However, other inert or reactive gases can be used.

As has been explained in the foregoing, according to the present invention, means for depositing a film and means for etching the deposited film to make flat the surface thereof are provided independently of each other. Accordingly, an increase in substrate temperature can be made far smaller, as compared with the conventional bias sputtering apparatus. Further, in the case where the film is deposited by a chemical vapor deposition method, the deposition rate of the film is very high, and moreover a film having a flat surface can be efficiently deposited even when the surface of a substrate is uneven.

Further, since means for depositing a film is provided with grids for controlling charged particles, the bombardment of a substrate with the charged particles can be suppressed by operating the grids. Thus, an increase in substrate temperature can be made very small, though the deposition rate of the film somewhat decreases.

In contrast to the above, when the grids are not operated, the deposition rate is very large, though the substrate temperature is raised by bombarding the substrate with the charged particles. Accordingly, by appropriately operating the grids, the substrate temperature and the deposition rate of film can be set to desired values. Thus, thin films suitable for various purposes can be obtained.

We claim:

1. A thin film deposition apparatus for depositing a film in a reaction vessel, comprising:
   deposition means provided in the reaction vessel for depositing a film on a substrate by plasma excited CVD; and
   etching means provided in said reaction vessel for dry-etching the film deposited by said deposition means, said etching means being provided in said reaction vessel independently of said deposition means.

2. A thin film deposition apparatus according to claim 1, wherein said plasma excited CVD is plasma excited CVD using microwave power.

3. A thin film deposition apparatus according to claim 1, wherein said plasma excited CVD is plasma excited CVD using radio frequency power.

4. A thin film deposition apparatus according to claim 3, wherein said deposited film is etched by sputtering using a hot filament type ion source.

5. A thin film deposition apparatus according to claim 1, wherein said etching means etches said deposited film by sputtering.

6. A thin film deposition apparatus according to claim 5, wherein said deposited film is etched by sputtering using a saddle field type ion source.

7. A thin film deposition apparatus according to claim 5, wherein said deposited film is etched by sputtering using a hot filament type ion source.

8. A thin film deposition apparatus according to claim 1, further comprising a rotatable susceptor for holding said substrate.

9. A thin film deposition apparatus according to claim 8, wherein said susceptor is provided with watercooling means.

10. A thin film deposition apparatus according to claim 8, wherein a single substrate is held on said susceptor.

11. A thin film deposition apparatus according to claim 8, wherein a plurality of substrates are held on said susceptor.

12. A thin film deposition apparatus according to claim 8, wherein said susceptor for holding said substrate is applied with a high-frequency voltage.

13. A method of depositing a film on a substrate, comprising the steps of:
   (a) forming vapor phase deposition material and vapor phase etching material at independent portions; and
   (b) directing said deposition material and said etching material simultaneously or alternately on a substrate, whereby deposition proceeds while deposited material being partly etched away.

14. A method according to claim 13, wherein said deposition material is a charged particle beam of one polarity.

15. A method according to claim 13, wherein said etching material is a particle beam.

16. A method according to claim 13, wherein said substrate is being rotated and said deposition material and said etching material are directed alternately on the substrate.

17. A method according to claim 16, wherein said deposition material is a flow of particles formed in microwave plasma end extracted therefrom through a grid of predetermined potential.

18. A method according to claim 16, wherein said etching material is a flow of argon ions and the film deposited is silicon oxide, whereby the etching rate of the argon ions is higher at angled portions than at flat portions of the deposited film.

19. A thin deposition for depositing a film in a reaction vessel, comprising:
   deposition means provided in the reaction vessel for depositing a film on a substrate; and
   etching means provided in said reaction vessel for dry-etching the deposited film by sputtering using a microwave discharge ion source, said etching means being provided in said reaction vessel independently of said deposition means.

20. A thin film deposition apparatus according to claim 19 wherein said deposition means deposits said film on said substrate by sputtering.

21. A thin film deposition apparatus according to claim 19, wherein said deposition means deposits said film on said substrate by plasma excited CVD.

22. A thin film deposition apparatus according to claim 21, wherein said plasma excited CVD is plasma excited CVD using microwave power.

23. A thin film deposition apparatus according to claim 21, wherein said plasma excited CVD is plasma excited CVD using radio frequency power.

24. A thin film deposition apparatus according to claim 19, further comprising a rotatable susceptor for holding said substrate.

25. A thin film deposition apparatus according to claim 24, wherein said suceptor is provided with water-cooling means.

26. A thin film deposition apparatus according to claim 24, wherein a single substrate is held on said susceptor.

27. A thin film deposition apparatus according to claim 24, wherein a plurality of substrates are held on said susceptor.

28. A thin film deposition apparatus according to claim 24, wherein said susceptor for holding said substrate is applied with a high-frequency voltage.

* * * * *